United States Patent
Kobashi

(10) Patent No.: US 7,893,932 B2
(45) Date of Patent: Feb. 22, 2011

(54) ELECTRONIC CIRCUIT, ELECTRO-OPTICAL DEVICE, AND ELECTRONIC APPARATUS INCLUDING THE SAME

(75) Inventor: Yutaka Kobashi, Mizuho (JP)

(73) Assignee: Sony Corporation, Tokyo (JP)

( * ) Notice: Subject to any disclaimer, the term of this patent is extended or adjusted under 35 U.S.C. 154(b) by 934 days.

(21) Appl. No.: 11/785,863

(22) Filed: Apr. 20, 2007

(65) Prior Publication Data
US 2007/0252829 A1    Nov. 1, 2007

(30) Foreign Application Priority Data
Apr. 28, 2006   (JP) ............................... 2006-124920

(51) Int. Cl.
*G09G 3/38*    (2006.01)
(52) U.S. Cl. ........................ 345/207; 345/102; 345/214; 250/214 AL; 250/214 R; 356/218
(58) Field of Classification Search ................. 345/101, 345/102, 207; 250/214 R, 206, 214 AL, 250/214 DC, 214 SW, 214 P; 356/218
See application file for complete search history.

(56) References Cited

U.S. PATENT DOCUMENTS

| | | | | |
|---|---|---|---|---|
| 5,479,208 A | * | 12/1995 | Okumura | 348/301 |
| 5,572,074 A | * | 11/1996 | Standley | 307/117 |
| 5,587,576 A | * | 12/1996 | Maki | 235/462.41 |
| 6,150,967 A | | 11/2000 | Nakamura | |
| 6,649,898 B1 | * | 11/2003 | Fleischer et al. | 250/214 R |
| 6,794,630 B2 | * | 9/2004 | Keshavarzi et al. | 250/214.1 |
| 7,319,220 B2 | * | 1/2008 | Soltesz et al. | 250/214 A |
| 2005/0218302 A1 | * | 10/2005 | Shin et al. | 250/214 R |
| 2005/0224697 A1 | * | 10/2005 | Nishiyama | 250/214 A |
| 2005/0269486 A1 | * | 12/2005 | Ozawa | 250/214 R |
| 2006/0033697 A1 | * | 2/2006 | Yang | 345/101 |
| 2006/0060757 A1 | * | 3/2006 | Takiba et al. | 250/214 SW |
| 2006/0261253 A1 | * | 11/2006 | Arao et al. | 250/214.1 |
| 2007/0045672 A1 | * | 3/2007 | Nishi et al. | 257/257 |

FOREIGN PATENT DOCUMENTS

| | | |
|---|---|---|
| JP | A-06-245152 | 9/1994 |
| JP | A-11-205247 | 7/1999 |
| JP | A-2000-183667 | 6/2000 |

OTHER PUBLICATIONS

New U.S. Patent Application filed on Apr. 20, 2007 in the name of Yutaka Kobashi.

* cited by examiner

*Primary Examiner*—Lun-Yi Lao
(74) *Attorney, Agent, or Firm*—K&L Gates LLP

(57) ABSTRACT

An electronic circuit, which has transistors disposed on a substrate, each transistor including an active layer made of thin-film polysilicon, includes a sensor that converts a measured quantity into a current value, a current-voltage conversion circuit that converts the current value into a voltage, and a voltage detection circuit that detects the voltage converted by the current-voltage conversion circuit and outputs a predetermined signal. The current-voltage conversion circuit includes a range-switching circuit that switches a current-voltage conversion range.

10 Claims, 10 Drawing Sheets

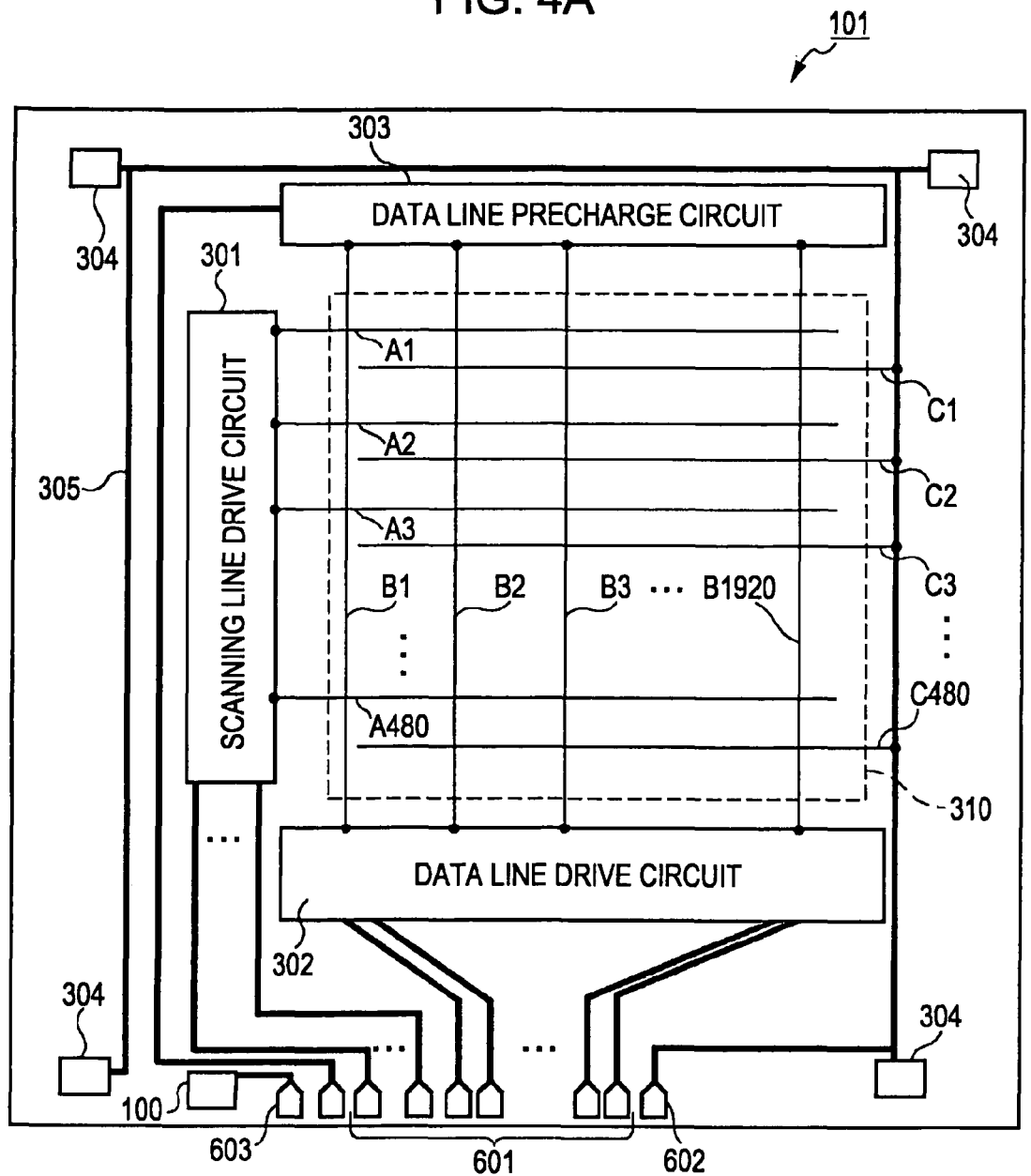

FIG. 7

<TABLE 1 (V1 = LOW)>

| OUT1 | OUT2 | OUT3 | OUT4 | OUT5 | OUT6 | OUT7 | OUT8 | SET POINT |
|------|------|------|------|------|------|------|------|-----------|
| H | L | L | L | L | L | L | L | 120 |
| H | H | L | L | L | L | L | L | 130 |
| H | H | H | L | L | L | L | L | 140 |
| H | H | H | H | L | L | L | L | 150 |
| H | H | H | H | H | L | L | L | 160 |
| H | H | H | H | H | H | L | L | 170 |
| H | H | H | H | H | H | H | L | 180 |
| H | H | H | H | H | H | H | L | 190 |
| H | H | H | H | H | H | H | H | N/A |

<TABLE 2 (V1 = HIGH)>

| OUT1 | OUT2 | OUT3 | OUT4 | OUT5 | OUT6 | OUT7 | OUT8 | SET POINT |
|------|------|------|------|------|------|------|------|-----------|
| L | L | L | L | L | L | L | L | N/A |
| H | L | L | L | L | L | L | L | 160 |
| H | H | L | L | L | L | L | L | 170 |
| H | H | H | L | L | L | L | L | 180 |
| H | H | H | H | L | L | L | L | 190 |
| H | H | H | H | H | L | L | L | 210 |
| H | H | H | H | H | H | L | L | 230 |
| H | H | H | H | H | H | H | L | 255 |
| H | H | H | H | H | H | H | H | 255 |

$\frac{W}{2L} \times \mu \times C0 \times (Vgs-Vth)^2$

PRIOR ART

ELECTRONIC CIRCUIT, ELECTRO-OPTICAL DEVICE, AND ELECTRONIC APPARATUS INCLUDING THE SAME

BACKGROUND

1. Technical Field

The present invention relates to electronic circuits, electro-optical devices, and electronic apparatuses including the same. More particularly, the invention relates to a circuit formed on a substrate using a thin-film polysilicon deposition technique, a liquid crystal display device including the circuit, and an electronic apparatus including the liquid crystal display device.

2. Related Art

In recent years, a technology in which various thin-film transistor circuits are formed on glass substrates using a low-temperature polysilicon deposition technique, i.e., a System On Glass (SOG) technology, has been actively developed. Examples include a monolithic driver in which a driver circuit is integrated onto a glass substrate of a liquid crystal display.

As one application of the SOG technology, it is conceivable to form a sensor and its sensing circuit on a glass substrate. For example, by using a structure in which an optical sensor and a sensing circuit are integrated onto a transparent substrate constituting a liquid crystal display, and in which the state of external light is detected, and the illuminance of a backlight is controlled on the basis of the detected results, it is possible to maintain the optimal visibility of the liquid crystal display regardless of the environment. There are many other sensors, such as temperature sensors, gyro sensors, and inclination sensors, that benefit from being disposed on glass substrates. In general, outputs of these sensors are analog signals. In order to process the analog signals by a digital logic circuit disposed on a glass substrate so as to be used for proper control, it is necessary to convert the signals to digital form with an A/D conversion circuit.

FIG. 11 is a circuit diagram showing an example of an A/D conversion circuit of a known current device. In the current device (sensor 1), one end is connected to a power supply voltage VD, and the other end is connected via a Node-A, the voltage of which is VA, to a drain electrode and a gate electrode of a transistor 2. A source electrode of the transistor 2 is connected to a power supply voltage VS. The Node-A is connected to a comparator circuit 3.

In the current device, which is the sensor 1, a current Isense, which flows between the power supply voltage VD and the Node-A, changes according to the quantity of a physical stimulus to be sensed and a voltage (VD−VA) applied between the power supply voltage VD and the Node-A.

In the transistor 2, the voltage between the gate and the source is given by the equation Vgs=VA−VS and the voltage between the drain and the source is given by the equation Vds=VA−VS. Hence, Vds=Vgs. Therefore, if the threshold value Vth of the transistor 2 satisfies the relationship Vth>0, the relationship Vds>Vgs−Vth is satisfied. When Vth<VA−VS, the transistor 2 always operates in a saturation region. The characteristics of a general MOS transistor in the saturation region are expressed by equation (1).

$$Ids = \frac{W}{2L} \times \mu \times C0 \times (Vgs - Vth)^2 \quad (1)$$

Here, W is the channel width of the transistor, L is the channel length, μ is the mobility, and C0 is the gate capacitance.

From Kirchhoff's law, the relationship Isense=Ids is obvious. Hence, equation (2) is satisfied.

$$Isense = \frac{W}{2L} \times \mu \times C0 \times (Vgs - Vth)^2 \quad (2)$$

Equation (2) can be transformed into equation (3).

$$Vgs = \sqrt{\frac{Isense \times 2L}{W \times \mu \times C0}} + Vth \quad (3)$$

Since VA=Vgs+VS, equation (4) is derived.

$$VA = \sqrt{\frac{Isense \times 2L}{W \times \mu \times C0}} + Vth + VS \quad (4)$$

Assuming that the current Isense does not depend on the voltage VA, it is possible to easily obtain the current Isense from the voltage VA.

One example of a sensor device that satisfies the assumption is an optical sensor device which uses a PN junction diode or a PIN junction diode. When a reverse bias is applied to such a device, the current Isense is a constant current source which generates a current proportional to the light illuminance in a certain range. Hence, equation (5) is valid.

$$VA = \sqrt{\frac{2L \times Isense}{W \times \mu \times C0}} + Vth + VS \quad (5)$$

That is, the current Isense is calculated from the voltage VA according to equation (6).

$$Isense = (VA - Vth - VS)^2 \times \frac{W \times \mu \times C0}{2L} \quad (6)$$

Here, the voltage VA of the Node-A is input to the comparator circuit 3. FIG. 12 is a circuit diagram showing a configuration of the comparator circuit 3. This circuit compares the input voltage Vin with the reference voltage Vref. If Vin(=VA)>Vref, the circuit outputs a High voltage (≈VD) to an output signal Out. If Vin(=VA)<Vref, the circuit outputs a Low voltage (≈VS) to the output signal Out. Therefore, when the reference voltage Vref is applied to the comparator circuit 3, by referring to the digital output result of the terminal of the output signal OUT, it is possible to find out whether the voltage VA is higher or lower than the reference voltage Vref. In such a case, when digital conversion is desired in 256 gradations, 255 comparator circuits 3 are arranged in parallel, and different reference voltages Vref are applied thereto. Alternatively, it is possible to perform conversion in the same manner by inputting a staircase waveform (255 STEP) to the reference voltage Vref, and by storing the output results. Which method is to be selected may be determined depending on the circuit area, power consumption, and sampling rate. Furthermore, it is of course possible to employ a configuration in which both methods are combined. Namely, it is possible to perform digital conversion in 256 gradations by inputting 16 staircase waveforms (15 STEP) having different levels into 16 corresponding comparators.

Furthermore, in the circuit shown in FIG. 12, preferably, transistors 3a, 3b, 3c, and 3d have the same size. For example, in each of the transistors 3a, 3b, 3c, and 3d, the channel width W is set at 10 μm, and the channel length is set at 6 μm.

Since the voltage VA is determined in a certain range as described above, by using equation (6), it is possible to determine the current Isense, which gives the physical quantity to be checked, for example, illuminance. That is, the output of the sensor can be A/D converted.

Furthermore, even in a sensor in which the current Isense of the sensor 1 is not constant and is a function of (VD−VA), A/D conversion can be performed using the same electronic circuit. For example, in a sensor device having a certain impedance Rsense that depends on a measured quantity, the current Isense is expressed by equation (7).

$$Isense = \frac{(VD - VA)}{Rsense} \qquad (7)$$

Examples of such a device include a temperature sensor including a resistor, and a gyro sensor including a variable resistor. A sensor is taken as an example, in which the impedance Rsense varies with temperature according to equation (8).

$$Rsense = R0 \times \exp\left(\frac{B}{T}\right) \qquad (8)$$

Here, T is the absolute temperature (K), and R0 and B are characteristic constants of the temperature sensor.

The following equation (9) is obtained from equations (4) and (7).

$$VA = \sqrt{\frac{2L \times (VD - VA)}{Rsense \times W \times \mu \times C0}} + Vth + VS \qquad (9)$$

The above equation is solved to give equation (10).

$$Rsense = \frac{2L \times (VD - VA)}{W \times \mu \times C0 \times (VA - Vth - VS)^2} \qquad (10)$$

Thus, the impedance Rsense is calculated from the voltage VA. By substituting the resulting value into equation (8), the temperature T is obtained.

However, in general, characteristics, in particular, saturation characteristics, of polysilicon thin-film transistors are inferior to those of MOS transistors which are formed on single-crystal silicon substrates. Therefore, polysilicon thin-film transistors have a problem in that the dynamic range where A/D conversion is possible is significantly narrow.

FIG. 13 is a graph showing output characteristics of transistors. A curve (A) indicates output characteristics of a MOS device formed on a single-crystal silicon device, and a curve (B) indicates output characteristics of a polysilicon thin-film transistor device. Substantially horizontal portions on the curves (A) and (B) each correspond to a saturation region which satisfies equation (1) and in which Vgs>Vth and Vgs−Vth<Vds<Vkink, where Vkink is the voltage at which a kink phenomenon starts to occur. The region in which Vds>Vkink, does not satisfy equation (1). In the MOS device formed on the single-crystal silicon device, Vkink is high and equation (1) is satisfied in a relatively wide range. (That is, the horizontal portion on the curve is large.) Consequently, the range of the current Isense that can be derived from equation (6) is relatively large.

For example, in a device with a Vkink of 10 V, Vds(=VA−VS) must be less than 10 V. Assuming that the channel width W is 10 μm, the channel length L is 6 μm, the mobility is 1,300 cm²/V/S, and the thickness of the gate oxide film is 100 nm, Isense is calculated to be less than about 3 mA from equation (4). With respect to the lower limit, theoretically, when Vgs→Vth(Va→Vth−Vs), Ids→0. However, in practice, since a slight leakage current always flows, even if Vgs→Vth, Ids→Ileak, and no change is observed in a range lower than a certain level. Furthermore, in practice, taking the maximum range ΔVth of production variation of Vth into account, VA must be approximately equal to or greater than ΔVth−VS. In consideration of all of the above, at Isense greater than about 1 nA, which is practical, and in a MOS device formed on a single-crystal device, it is possible to perform A/D conversion in an Isense range of 1 nA to 3 mA using the structure shown in FIG. 11. That is, the measurement dynamic range is about 3,000,000:1. Furthermore, in order to shift the range to the lower current side, the channel width W of the transistor 2 is decreased (or the channel length L is increased). In order to shift the range to the higher current side, the channel width W of the transistor 2 is increased (or the channel length L is decreased). In either case, the dynamic range does not change.

However, in a polysilicon thin-film transistor, in particular, in a low-temperature polysilicon (LTPS) thin-film transistor which is formed by a low-temperature process at 600° C. or lower, the mobility is about 100 cm²/V/S, and the kink voltage is low. A kink phenomenon starts to occur at a Vkink of about 6 V. Furthermore, the off-leak current is increased, and when Vds=Vgs=Vth, Ileak is about 10 nA (W=10 μm and L=6 μm). The maximum range ΔVth is also large being from several tens of millivolts to about 200 mV. The calculations performed in the same manner as above show that the measurable current range is 10 nA to 80 μA in terms of the current Isense, and the dynamic range is about 8,000:1, which is considerably lower than that of the MOS transistor.

As described above, in the A/D conversion circuit including polysilicon thin-film transistors, it is not possible to obtain a sufficient A/D conversion dynamic range compared with the case in which MOS transistors on a single-crystal silicon device are used, which is a problem.

JP-A-6-245152 is an example of related art.

SUMMARY

An advantage of some aspects of the invention is that an A/D conversion circuit including polysilicon thin-film transistors is provided in which a sufficient A/D conversion dynamic range can be obtained and which is suitable for polysilicon thin-film transistors.

An aspect of the invention relates to an electronic circuit having transistors disposed on a substrate, each transistor including an active layer made of thin-film polysilicon, the electronic circuit including a sensor that converts a measured quantity into a current value, a current-voltage conversion circuit that converts the current value into a voltage, and a voltage detection circuit that detects the voltage converted by the current-voltage conversion circuit and outputs a predetermined signal, wherein the current-voltage conversion circuit includes a range-switching circuit that switches a current-voltage conversion range.

According to the above aspect of the invention, in the electronic circuit having transistors disposed on the substrate, each transistor including an active layer made of thin-film polysilicon, the measured quantity detected by the sensor is converted into the current value, and the converted current value is converted into the voltage by the current-voltage conversion circuit. The voltage converted by the current-voltage conversion circuit is detected and a predetermined signal is output by the voltage detection circuit. The current-voltage conversion range can be switched by the range-switching circuit provided on the current-voltage conversion circuit, and thus, it is possible to secure a sufficient A/D conversion dynamic range.

In the electronic circuit, preferably, the current-voltage conversion circuit has field-effect transistors each including an active layer made of thin-film polysilicon disposed on the substrate and includes a first transistor and a second transistor connected in parallel, and a control circuit that is connected to the second transistor and controls a current flowing into the second transistor, wherein the second transistor and the control circuit constitute the range-switching circuit, and by controlling the current flowing into the second transistor by a range switching signal, the current-voltage conversion range of the current-voltage conversion circuit is switched.

In such a structure, since the current-voltage conversion range (range to be measured) of the current-voltage conversion circuit can be switched by the range-switching signal, it is possible to secure a sufficient A/D conversion dynamic range even in a circuit including field-effect transistors each including an active layer made of thin-film polysilicon.

Furthermore, in the electronic circuit, preferably, the sensor is a PIN junction diode or a PN junction diode including an active layer made of thin-film polysilicon, the active layer being the same layer as the active layer of each of the first transistor and the second transistor, and the measured quantity corresponds to a light illuminance.

In such a structure, it is possible to measure the illuminance of light with which the substrate is irradiated without an increase in cost. For example, when the electronic circuit is applied to a display device, it is possible to maintain optimal display quality in response to external light.

Furthermore, in the electronic circuit, preferably, the sensor is a resistor including the thin-film polysilicon which is the same as that for the active layer of each of the thin-film transistors, and the measured quantity corresponds to a temperature.

In such a structure, it is possible to measure the temperature of the substrate without an increase in cost. For example, when the electronic circuit is applied to a display device, it is possible to control gradations optimally so that optimal display quality is maintained in response to temperature.

Furthermore, in the electronic circuit, preferably, the voltage detection circuit includes a plurality of comparator circuits having the same circuit configuration, and different reference voltages are applied to the comparator circuits.

In such a structure, it is possible to measure multiple voltages output from the current-voltage conversion circuit in a short period of time to A/D convert the measured quantity of the sensor.

Furthermore, in the electronic circuit, preferably, the voltage detection circuit includes a plurality of CMOS inverters or CMOS clocked inverters having different ratios of the channel width of an N-channel transistor to the channel width of a P-channel transistor.

In such a structure, it is possible to A/D convert the voltages output from the current-voltage conversion circuit with a significantly small number of elements.

Furthermore, in the electronic circuit, preferably, the voltage detection circuit is a comparator circuit, and different reference voltages are applied sequentially thereto.

In such a structure, it is possible to measure multiple voltages output from the current-voltage conversion circuit with a small number of elements to A/D convert the measured quantity of the sensor.

Another aspect of the invention relates to an electro-optical device which includes the electronic circuit in accordance with an embodiment of the invention.

In such a structure, since an A/D conversion circuit can be formed on a glass substrate in the same manufacturing step as an active matrix, it is possible to manufacture an electro-optical device with a built-in sensor at low cost.

A further aspect of the invention relates to an electronic apparatus which includes at least the electro-optical device in accordance with an embodiment of the invention, and a display information processing circuit that processes display information to be displayed on the electro-optical device.

According to this aspect of the invention, by incorporating an electro-optical device and a display information processing circuit that processes display information displayed on the electro-optical device into an electronic apparatus, it is possible to manufacture a multifunctional electronic apparatus excellent in display quality at lower cost. Furthermore, since the freedom with which the sensor can be arranged is enhanced, the overall dimensions can be reduced, and it is possible to manufacture an electronic apparatus with excellent design properties, which is also advantageous.

BRIEF DESCRIPTION OF THE DRAWINGS

The invention will be described with reference to the accompanying drawings, wherein like numbers reference like elements.

FIG. 4A is a diagram showing an active matrix substrate of a liquid crystal display device according to the first embodiment.

FIG. 7 shows an example of look-up tables according to the first embodiment.

DESCRIPTION OF EXEMPLARY EMBODIMENTS

Liquid crystal display devices according to embodiments of the invention will be described below with reference to the drawings.

First Embodiment

Figure 1:
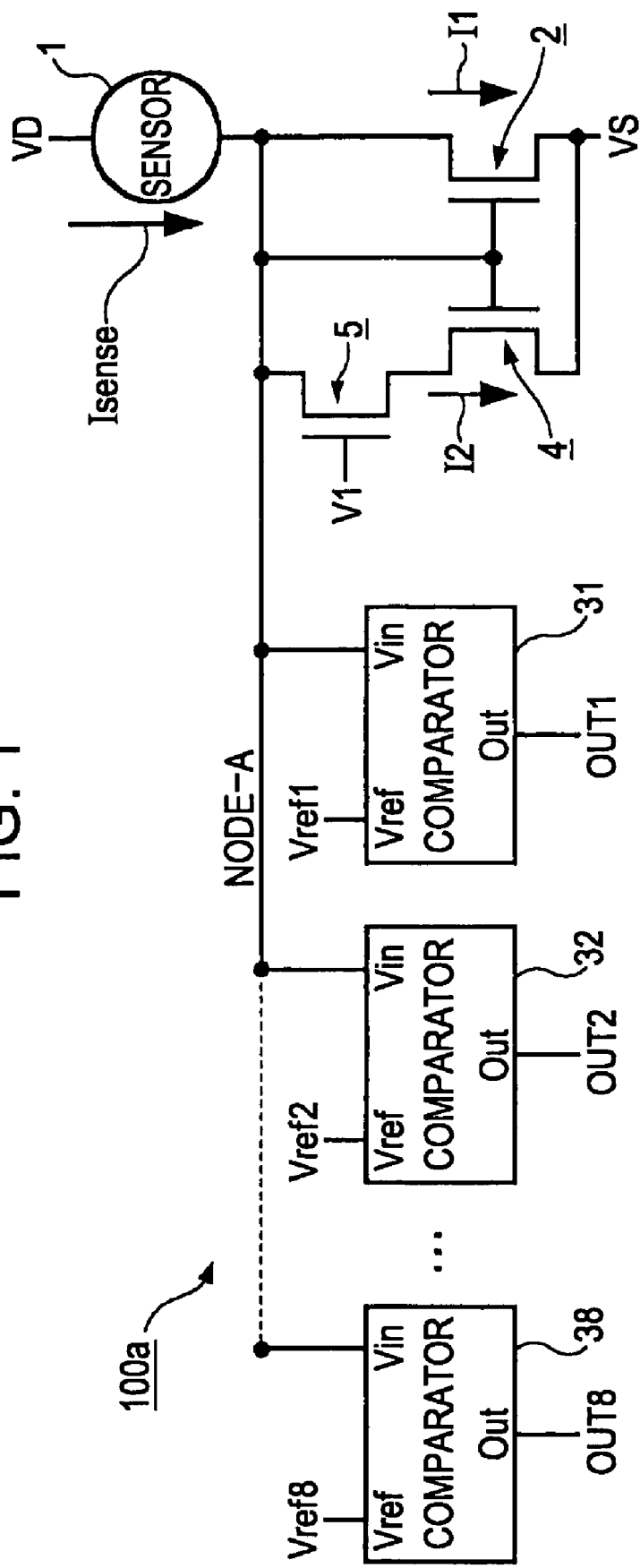
FIG. 1 is a circuit diagram showing a sensor and an A/D conversion circuit according to a first embodiment of the invention.
Figure 11:
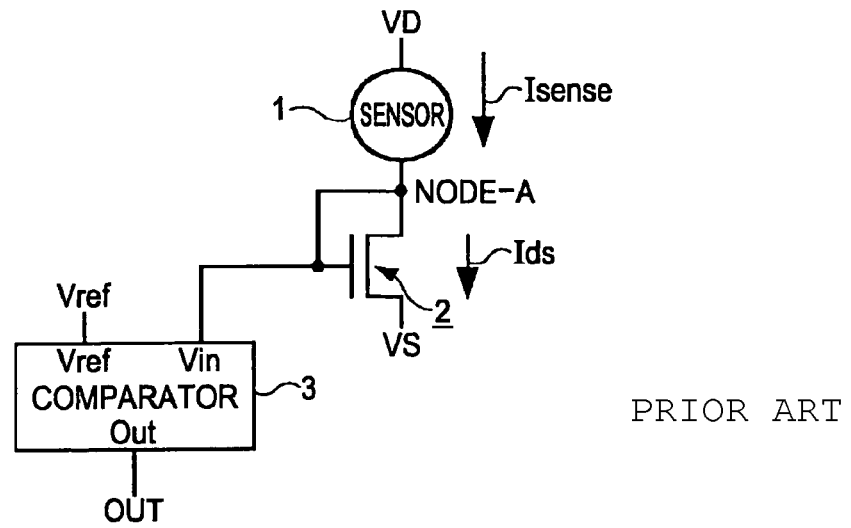
FIG. 11 is a circuit diagram showing a sensor and an A/D conversion circuit according to a known example.

FIG. 1 is a diagram showing a sensor 1 and an A/D conversion circuit 100a (electronic circuit) realizing an electronic circuit in accordance with a first embodiment of the present invention. Elements that are the same as those of the known structure shown in FIG. 11 are designated by the same reference numerals, and a description thereof is omitted. Referring to FIG. 1, a transistor 2 (first transistor), a transistor 4 (second transistor), a transistor 5 (control circuit), and transistors constituting comparator circuits 31 to 38 are field-effect transistors each including an active layer made of thin-film polysilicon disposed on a glass substrate (substrate).

The transistor 2, the transistor 4, and the transistor 5 constitute a current-voltage conversion circuit that converts a current into a voltage. The transistor 4 and the transistor 5 constitute a range-switching circuit that switches the current-voltage conversion range (measurement range) of the current-voltage conversion circuit.

As shown in FIG. 1, the transistor 2 and the transistor 4 are connected in parallel between a Node-A and a power supply voltage VS. The transistor 5 (control circuit) is connected in series with the transistor 4 between the Node-A and a drain electrode, the transistor 5 (control circuit) controlling the current flowing into the transistor 4. A range-switching signal V1 is connected to a gate electrode of the transistor 5, the range-switching signal V1 switching the current-voltage conversion range.

In this embodiment, the sensor 1 is a photodiode sensor that measures the state of external light. The photodiode sensor is a lateral PIN photodiode including an active layer made of thin-film polysilicon which is the same layer formed in the same manufacturing step as thin-film polysilicon constituting the active layer of each of the transistors 2, 4, and 5 or the layer having the same thickness as thin-film polysilicon constituting the active layer of each of the transistors 2, 4, and 5. In the sensor 1, a cathode electrode is connected to a power supply voltage VD, and an anode electrode is connected to the Node-A. The sensor 1 is always used in a reverse bias state. In a proper bias voltage range, current Isense is proportional to the illuminance of external light and does not depend on an applied bias voltage (VD−VA).

The transistor 4 has a channel width W that is 99 times that of the transistor 2, and the transistor 5 has the same channel width W as that of the transistor 4. All the transistors have the same channel length L. In this example, the channel width W of the transistor 2 is 10 μm, the channel width W of each of the transistor 4 and the transistor 5 is 990 μm, and the channel length L of each of the transistors 2, 4, and 5 is 6 μm.

With respect to power supply voltages VD and VS applied from external sources, for example, VD=8 V and VS=0 V. Reference voltages Vref1 to Vref8 are reference voltages applied from external sources. In this example, Vref1=1.5 V, Vref2=2.0 V, Vref3=2.5 V, Vref4=3.0 V, Vref5=3.5 V, Vref6=4.0 V, Vref7=4.5 V, and Vref8=5.0 V.

Here, V1 is a range-switching signal and has the same potential as the power supply voltage VD or the power supply voltage VS. When V1=VS, the transistor 5 is OFF. Thus, a current I2 flowing between drain and source of the transistor 4 is nearly equal to zero, and the same operation as in the known example shown in FIG. 11 is performed. That is, when Isense=I1, provided that the mobility of each of the transistors 2 and 4 is 100 cm$^2$/V/S, Vkink=6 V, the thickness of the gate insulating film is 100 nm, and Ileak of the transistor 2 at Vds=Vgs=Vth is 10 nA, equation (6) is satisfied in a I1 (=Isense) range of 10 nA to 80 μA.

When V1=VD, each of the transistors 2 and 4 operates in a saturation region at the same gate voltage (Vgs=VA−VS), and thus I2=I1×99. That is, since Isense=I1+I2, Isense=I1×100. Since equation (6) is satisfied in the I1 range of 10 nA to 80 μA from the calculations described above, measurement can be performed at Isense in a range of 1 μA to 8 mA. When the results in cases where V1=VD and V1=VS are combined, it is possible to perform measurement at Isense in a range of 10 nA to 8 mA. That is, the measurement dynamic range is about 800,000:1. In order to perform switching of the range-switching signal V1, a method may be used in which measurement is performed at V1=VD and at V1=VS for each scanning, and the results are combined and output. Alternatively, it may be possible to adopt a logical structure in which measurement is first performed at V1=VS, and if all the results (output signals OUT) are High, measurement is performed again at V1=VD. Alternatively, a configuration may be used in which a sensor 1 and an A/D conversion circuit for measuring the range are separately provided in parallel, and the range is switched on the basis of the measurement result thereof.

In such a manner, the current Isense is converted into the voltage VA of the Node-A, the resultant value is measured by a plurality of comparator circuits 31 to 38 having the same circuit configuration. Here, the reference voltages Vref1 to Vref8 are set so as to satisfy the relationship VS<Vref1<Vref2...<Vref8<VD. For example, when output signals OUT1 to OUT3 result in Low (≈VS) and output signals OUT4 to OUT8 result in High (≈VD), it can be determined that Vref3<VA<Vref4. By reading the outputs of the output signals OUT1 to OUT8 in such a manner, it is possible to measure the voltage VA in 9 stages, from which the current Isense is also calculated in 9 stages using equation (6). The results can be easily converted into illuminance. Additionally, the comparator circuits 31 to 38 each may have the same configuration as that of the known example shown in FIG. 12, or may have a configuration shown in FIG. 2 or 3.

Figure 2:
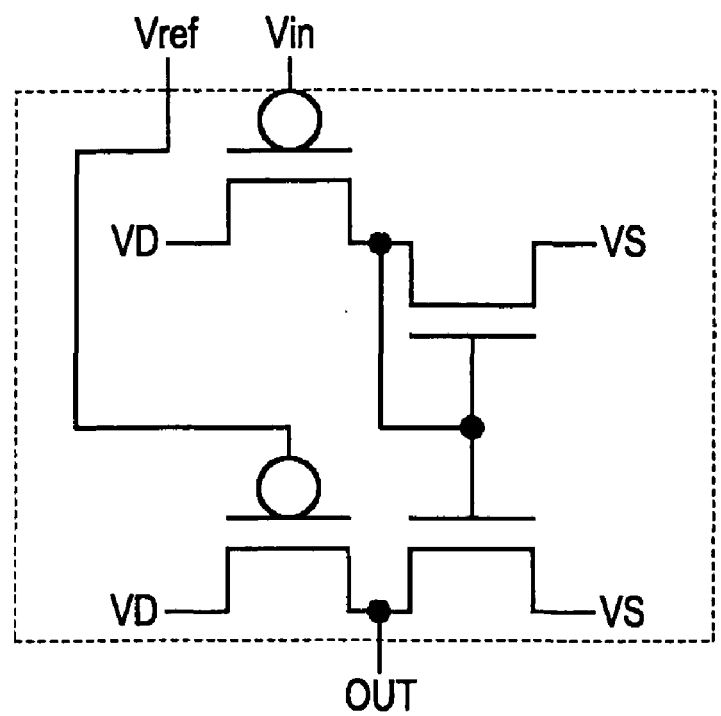
FIG. 2 is a detailed circuit diagram of each comparator circuit according to an example of the first embodiment.
Figure 3:
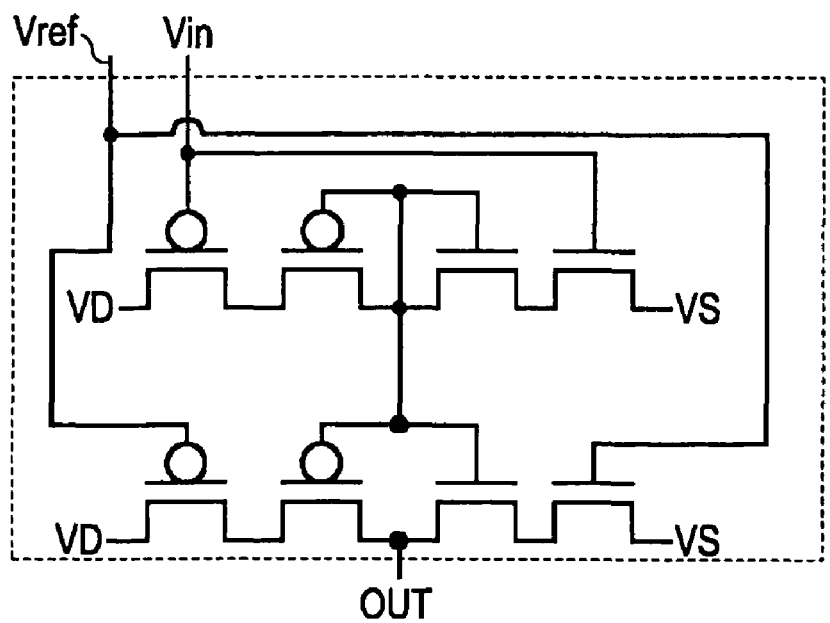
FIG. 3 is a detailed circuit diagram of each comparator circuit according to another example of the first embodiment.
Figure 12:
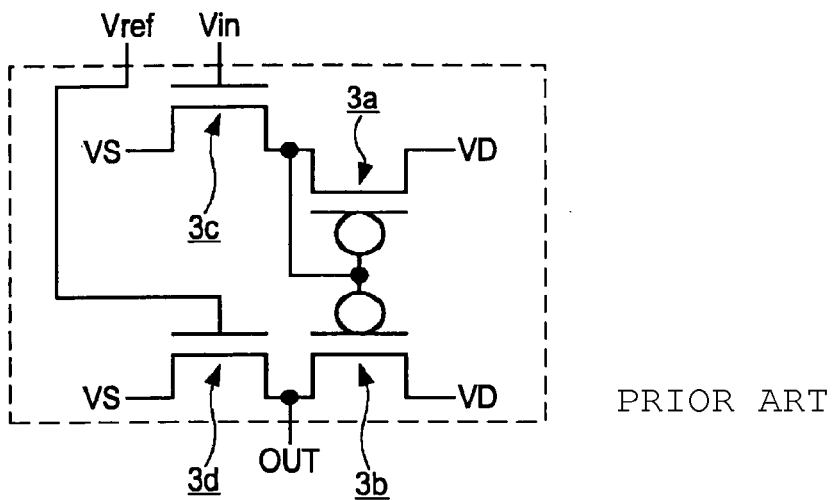
FIG. 12 is a detailed circuit diagram of a known comparator circuit.
Figure 13:
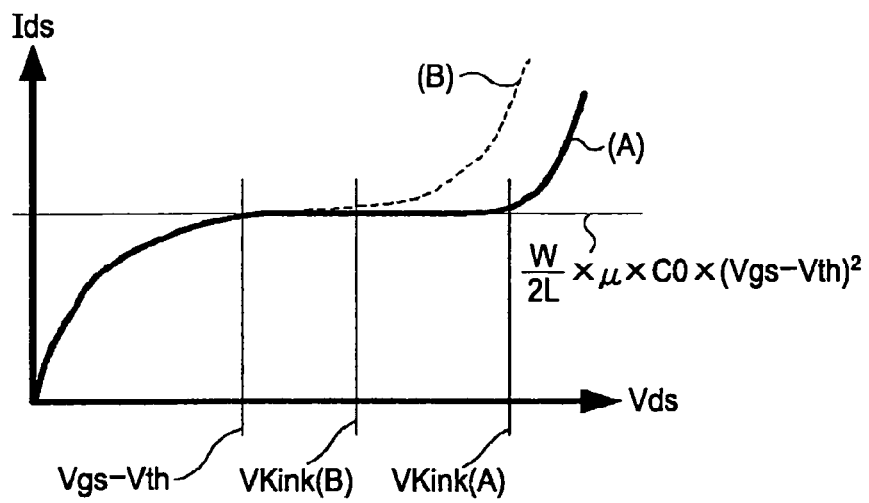
FIG. 13 is a graph showing output characteristics of a known thin-film transistor.

In the configuration shown in FIG. 2, Nch and Pch are reversed in TFTs compared with the configuration shown in FIG. 12. The configuration shown in FIG. 12 is suitable when the reference voltage Vref is closer to the power supply voltage VS, and the configuration shown in FIG. 2 is suitable when the reference voltage Vref is closer to the power supply voltage VD. Meanwhile, in a configuration shown in FIG. 3, although the number of elements is large and the circuit area is large, the range of the reference voltage Vref that can be operable is wide compared with the configuration shown in FIG. 12 or 2. Furthermore, a configuration is also conceivable in which a constant current source (e.g., a transistor in which a bias voltage is applied to a gate) is connected in series to the power supply voltage VD or the power supply voltage VS in the configuration shown in FIG. 12 or 2 so as to increase the operating margin. The most suitable comparator may be selected by a trade-off between the area, operating margin, and the like.

FIG. 4A is a diagram showing an active matrix substrate 101 for a transmissive-mode VGA-resolution liquid crystal display device for realizing an electro-optical device according to the first embodiment of the invention. On the active matrix substrate 101, 480 scanning lines A1 to A480 and 1,920 data lines B1 to B1920 are disposed so as to be orthogonal to each other, and 480 capacitor lines C1 to C480 are arranged in parallel and alternately with the scanning lines A1 to A480. The capacitor lines C1 to C480 are short-circuited with each other and connected to a common voltage input terminal 602. Conducting portions 304 are also connected to the common voltage input terminal 602. The sensor 1 and the A/D conversion circuit 100a shown in FIG. 1 are also disposed on the active matrix substrate 101, and the output signals OUT1 to OUT8 are connected to an output terminal 603 so that an output is produced in response to the illuminance of external light.

Figure 4B:
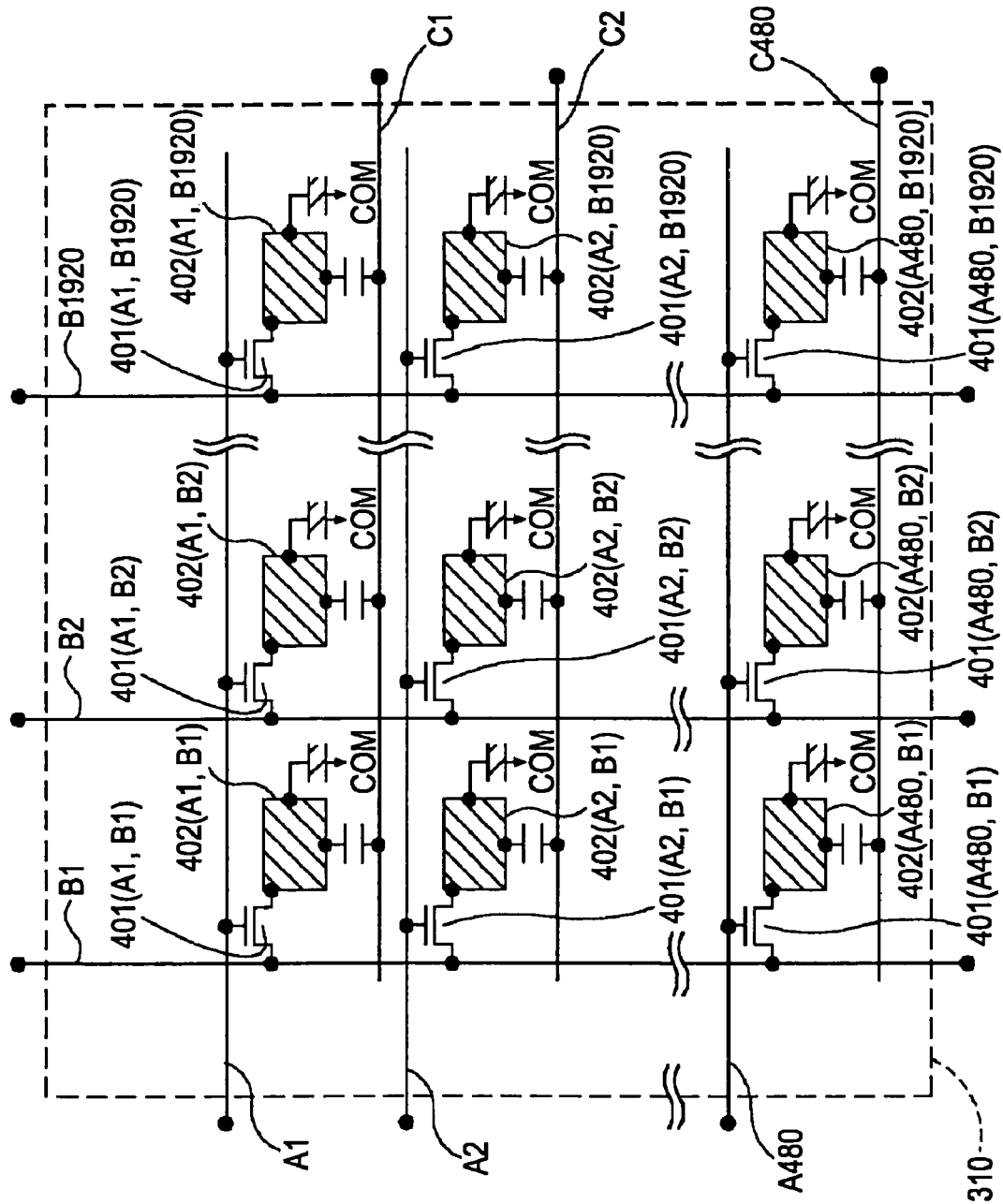
FIG. 4B is an enlarged diagram of a section surrounded by a dotted line in FIG. 4A.

FIG. 4B is an enlarged diagram of a section 310 surrounded by a dotted line in FIG. 4A. At an intersection of each of scanning lines An (where n is an integer satisfying the relationship $1 \leq n \leq 480$) and each of data lines Bm (m is an integer satisfying the relationship $1 \leq m \leq 1,920$), a pixel switching element 401 (An,Bm) including an N-channel field-effect transistor made of thin-film polysilicon is disposed. A gate electrode thereof is connected to the scanning line An, and a source electrode and a drain electrode thereof are connected to the data line Bm and a pixel electrode 402 (An,Bm), respectively. A pixel electrode 402 (An,Bm) and a capacitor line Cn form an auxiliary capacitor, and when the active matrix substrate 101 is assembled as a liquid crystal display device, the pixel electrode 402 (An,Bm) and a counter substrate electrode (common electrode) form a capacitor with a liquid crystal element therebetween. Here, the transistor 2, the transistor 4, the transistor 5, transistors constituting the comparator circuits 31 to 38, and pixel switching elements 401 (An,Bm) are manufactured in the same step.

The scanning lines A1 to A480 are connected to a scanning line drive circuit 301, from which driving signals are supplied. The data lines B1 to B1920 are connected to a data line drive circuit 302 and a data line precharge circuit 303, from which image signals and precharge voltages are respectively supplied. The scanning line drive circuit 301, the data line drive circuit 302, and the data line precharge circuit 303 are connected to signal input terminals 601, from which necessary signals and power supply voltages are supplied. The scanning line drive circuit 301, the data line drive circuit 302, the data line precharge circuit 303 are formed by integrating polysilicon thin-film transistors on the active matrix substrate, and are manufactured in the same step as the pixel switching elements 401 (An,Bm), thus constituting a drive circuit built-in liquid crystal display device.

Figure 5:
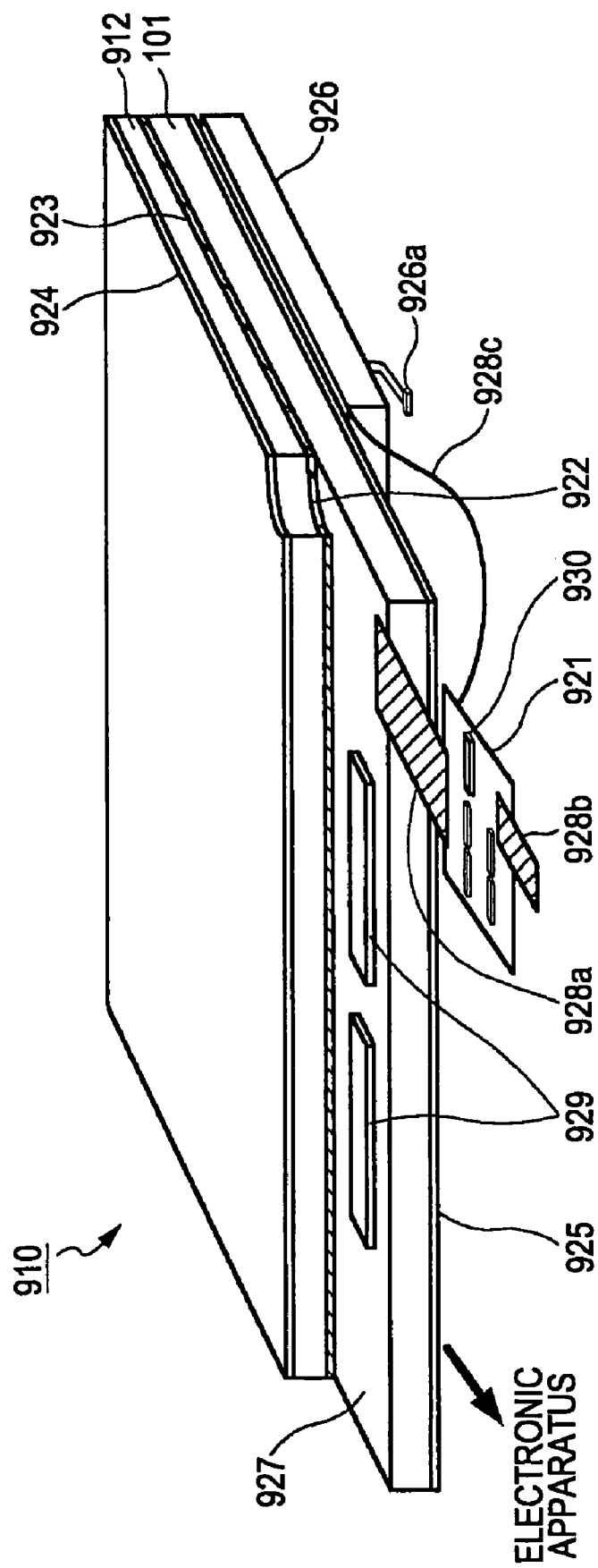
FIG. 5 is a perspective schematic view of the liquid crystal display device according to the first embodiment.

FIG. 5 is a perspective schematic view (partially sectional view) of a transmissive-mode VGA-resolution liquid crystal display device including the active matrix substrate shown in FIGS. 4A and 4B according to the first embodiment. In a liquid crystal display device 910, a liquid crystal material 922 having a nematic phase is interposed between the active matrix substrate 101 (first substrate) and a counter substrate 912 (second substrate). The active matrix substrate 101 and the counter substrate 912 are bonded with each other with a sealing material 923 to enclose the liquid crystal material 922. Although not shown in the drawing, an alignment film is disposed over the pixel electrodes of the active matrix substrate 101, the alignment film being formed by coating of an alignment material composed of polyimide or the like and subjected to rubbing treatment. Furthermore, although not shown in the drawing, the counter substrate 912 is provided with color filters corresponding to the pixels, a black matrix that prevents light leakage and improves contrast, and a counter electrode composed of an ITO film to which a common voltage is applied. An alignment material composed of polyimide or the like is applied by coating on a surface, which is in contact with the liquid crystal material 922, of the counter substrate 912, and the resulting alignment film is subjected to rubbing treatment in a direction which is orthogonal to the rubbing treatment direction of the alignment film of the active matrix substrate 101.

Furthermore, an upper polarizer 924 is disposed on the outer surface of the counter substrate 912, and a lower polarizer 925 is disposed on the outer surface of the active matrix substrate 101. The upper polarizer 924 and the lower polarizer 925 are arranged such that the polarization directions are orthogonal to each other (in a cross-Nicol configuration). Furthermore, a backlight unit 926, which is a surface illuminant, is disposed under the lower polarizer 925. The backlight unit 926 may have a structure in which a light guide plate or a diffusion plate is fixed on a cold-cathode tube or an LED, or may be a unit that emits light from the entire surface by means of EL elements. The backlight unit 926 is connected via a connector 926a to an electronic apparatus body, and power is supplied. Although not shown in the drawing, according to need, an outer shell may be provided. Alternatively, a protective glass or acrylic plate may be mounted further on the upper polarizer 924, or an optically compensating film may be attached in order to improve the viewing angle.

Furthermore, the active matrix substrate 101 has an extended section 927 protruding form the counter substrate 912. A flexible substrate FPC928a and an external driver IC929 are mounted on the signal input terminals 601 (refer to FIG. 4A), the common voltage input terminal 602 (refer to FIG. 4A), and the output terminal 603 (refer to FIG. 4A) which lie on the extended section 927, and a plurality of signal input terminals on the active matrix substrate 101 are electrically connected thereto. In the example shown in FIG. 5, two ICs constitute the external driver IC929, but one or three or more ICs may constitute the external driver IC929. The flexible substrate FPC928a is connected to a control substrate 921 provided with a power supply IC, a signal control IC, a capacitor, a resistor, ROM, a backlight control unit 930, etc., so that reference voltages, control signals, and image data are supplied to the active matrix substrate 101. The control substrate 921 is also connected via a connector 928c to the backlight unit 926, and the backlight control unit 930 on the control substrate 921 enables ON/OFF control and brightness adjustment of the backlight unit 926.

The control substrate 921 inputs via the flexible substrate FPC928a signals (output signals OUT1 to OUT8) of the sensor 1 and the A/D conversion circuit 100a that are output from the output terminal 603. Similarly, the control substrate 921 outputs range-switching signals V1 via the flexible substrate FPC928a to the sensor 1 and the A/D conversion circuit 100a, and thus the measurement range of the sensor 1 and the A/D conversion circuit 100a can be switched. Since the output signals OUT1 to OUT8 change in response to the external illuminance, the backlight control unit 930 on the control substrate 921 adjusts the brightness of the backlight unit 926 or turns ON/OFF the backlight unit 926 on the basis of the signals, and thus the backlight unit 926 can be controlled such that optimal visibility is set according to external light.

Figure 6:
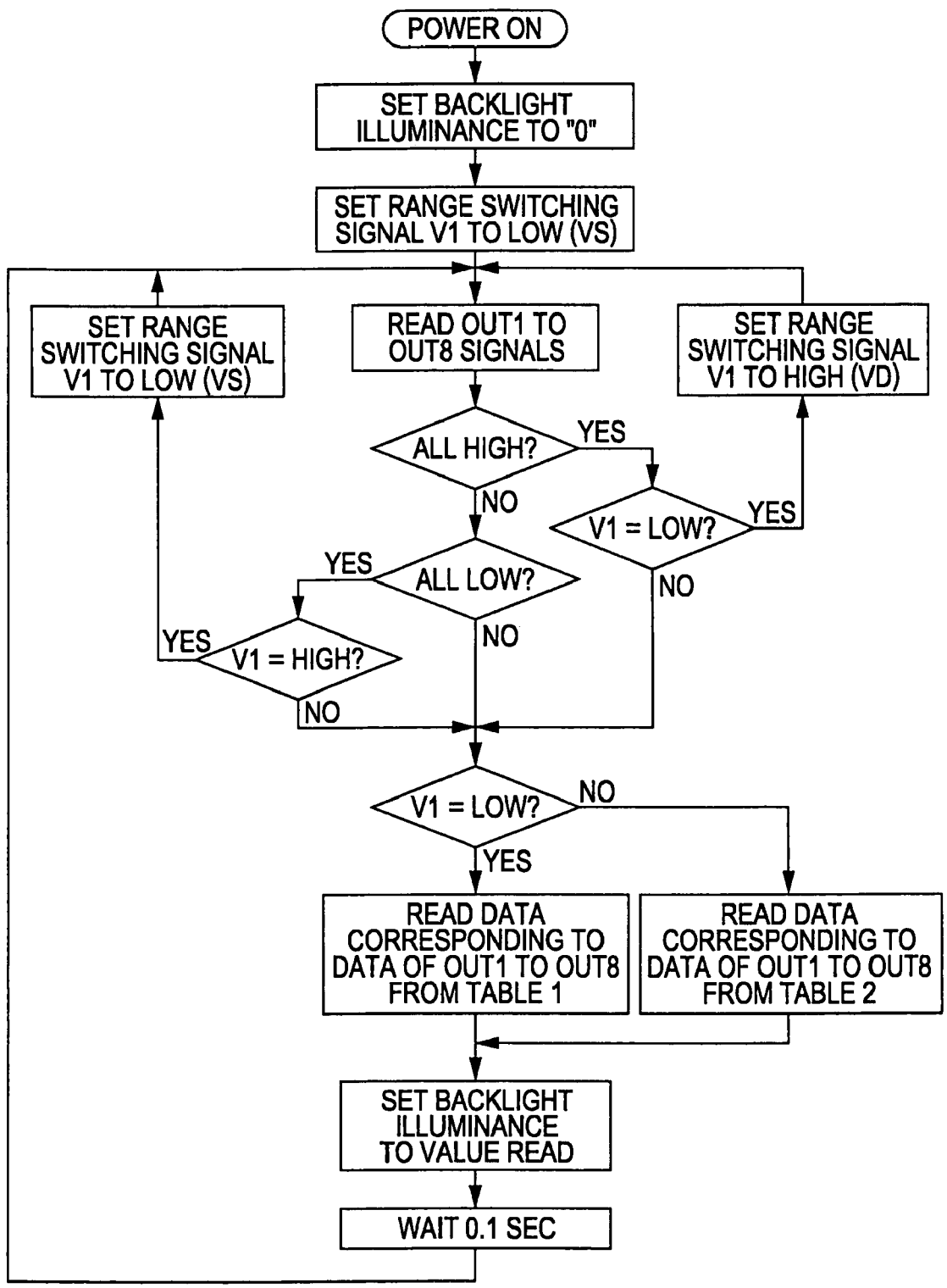
FIG. 6 is a flowchart showing an example of a backlight control algorithm of a backlight control unit according to the first embodiment.

A specific backlight control algorithm of the backlight control unit 930 is shown in FIG. 6. The brightness control signals sent from the backlight control unit 930 to the backlight unit 926 constitute 1 byte of data (0 to 255). When the control signal is 255, the brightness is maximum. When the control signal is 0, the backlight is off. First, the backlight control unit 930 sets V1 to be equal to VS and reads data of output signals OUT1 to OUT8. If the output signals OUT1 to OUT8 are all High (VD), V1 is switched to VD, and reading is performed again. After switching, if the output signals OUT1 to OUT8 are all Low (VS), V1 is again switched to VS. The output signals OUT1 to OUT8 are read by switching the range in such a manner. With reference to the look-up tables shown in FIG. 7, the set point is read on the basis of the status of the output signals OUT1 to OUT8 and V1, and the backlight illuminance is set to the set point read. In this algorithm, such an operation is repeated every 0.1 seconds. The look-up tables shown in FIG. 7 are arranged such that when the illuminance is very low (substantially equal to the threshold detectivity of the sensor 1), the backlight is turned on at a certain illuminance so as to prevent glare; and as the brightness increases, the illuminance is increased so as to prevent visibility from being affected by external light. Since the lower limit of the range in the case where V1=VD overlaps with the upper limit of the range in the case where V1=VS, the set points overlap. Since the transmissive-mode liquid crystal display device is taken as an example in this embodiment, the backlight illuminance is set so as to flatly increase with external light. However, in the case of a transflective-mode liquid crystal display device, when the brightness of external light increases to such an extent that satisfactory visibility is obtained only by the reflective mode, the backlight is turned off (setting=0).

In this embodiment, a structure has been described in which external illuminance is measured by the sensor 1, and the backlight brightness is automatically adjusted. However, in accordance with other embodiments of the invention, various sensors may be integrated onto substrates, such as a structure in which a temperature sensor is integrated onto a substrate, and by controlling the temperature dependency of liquid crystal or backlight, optimal display characteristics are always obtained. For example, in the case where a temperature sensor in which the impedance changes with temperature is built in as expressed by equation (8), using equation (10) instead of equation (6), the impedance Rsense is calculated from the voltage VA, and by substituting the resulting value into equation (8), the temperature is obtained. On the basis of this result, the backlight unit 926 may be subjected to light modulation, or the γ characteristics are controlled so as to be always optimal by the external driver IC 929. In such a manner, embodiments of the invention can be applied to various fields.

When equations (6) and (10) are used, the threshold value Vth and the mobility μ are required. In the case where there are variations in Vth and μ from transistor to transistor, calibration is performed in advance, a voltage VA to current Isense (or VA to Rsense) conversion table on the basis of equations (6) and (10) is separately written into the module by EPROM or the like, and the table is referred to when conversion is performed.

Figure 8:
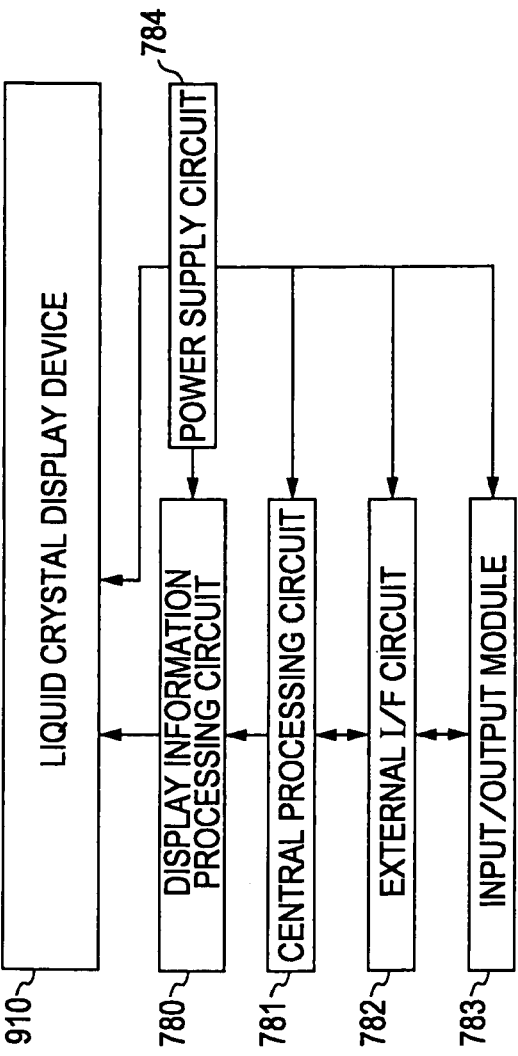
FIG. 8 is a block diagram of an electronic apparatus according to the first embodiment.

FIG. 8 is a block diagram of an electronic apparatus according to the first embodiment. The electronic apparatus includes the liquid crystal display device 910, which is an electro-optical device, described with reference to FIG. 5, a display information processing circuit 780 that controls the device, a central processing circuit 781, an external I/F circuit 782, an input/output module 783, and a power supply circuit 784. The display information processing circuit 780 rewrites image data stored in random access memory (RAM) appropriately on the basis of a command from the central processing circuit 781, and supplies image signals together with timing signals to the liquid crystal display device 910. The central processing circuit 781 carries out various arithmetic operations on the basis of input from the external I/F circuit 782, and outputs commands to the display information processing circuit 780 and the external I/F circuit 782 on the basis of arithmetic operations. The external I/F circuit 782 sends information from the input/output module 783 to the central processing circuit 781 and controls the input/output module 783 on the basis of commands from the central processing circuit 781. Examples of the input/output module 783 include a switch, a keyboard, a hard disk, and a flash memory unit. The power supply circuit 784 supplies predetermined power supply voltages to the individual constituent elements described above.

Specific examples of the electronic apparatus include monitors, TVs, notebook-sized personal computers, PDAs, digital cameras, video cameras, mobile phones, photoviewers, video players, DVD players, and audio players.

As described above, by forming the sensor 1 and A/D conversion circuit 100a having the configuration shown in FIG. 1 on the active matrix substrate 101, and fabricating an electro-optical device using the resulting structure, it is possible to produce a high value-added panel. Furthermore, by applying the electro-optical device to an electronic apparatus, it is possible to realize an electronic apparatus having high display quality.

Second Embodiment

Figure 9:
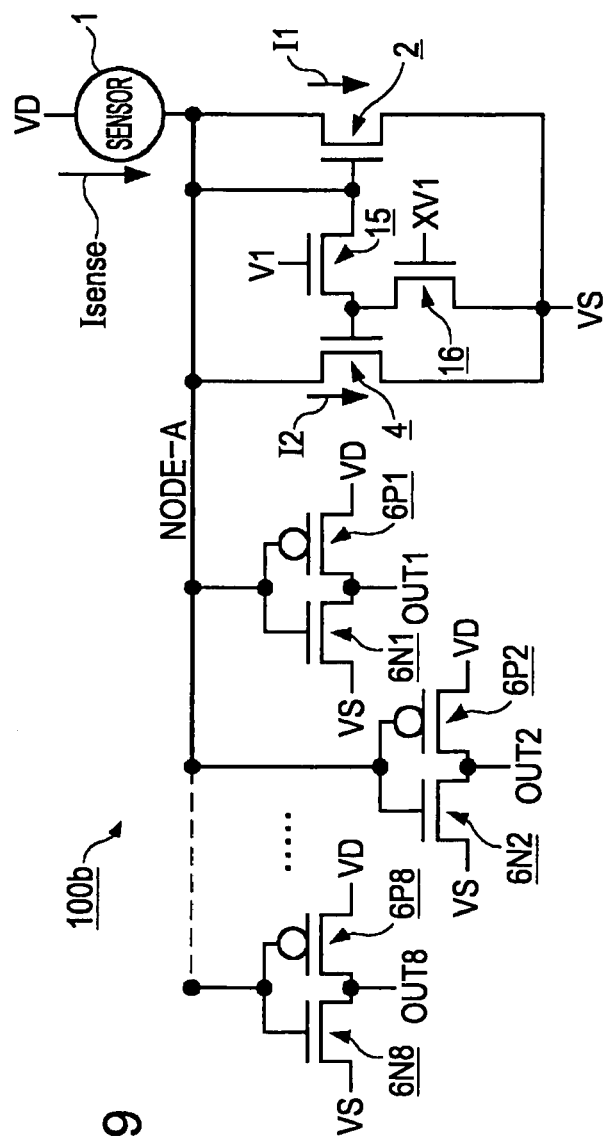
FIG. 9 is a circuit diagram showing a sensor and an A/D conversion circuit according to a second embodiment of the invention.

FIG. 9 is a circuit diagram showing a sensor 1 and an A/D conversion circuit 100b according to a second embodiment of the invention. Referring to FIG. 9, a transistor 2, a transistor 4, a transistor 15, and a transistor 16 constitute a current-voltage conversion circuit that converts a current into a voltage. The transistor 4, the transistor 15, and the transistor 16 constitute a range-switching circuit that switches the current-voltage conversion range of the current-voltage conversion circuit.

The transistor 4 is disposed in parallel to the transistor 2, a drain electrode being connected to a Node-A, a source electrode being connected to a power supply voltage VS. A gate electrode of the transistor 4 is connected via the transistor 15 to the Node-A, and connected via the transistor 16 to the power supply voltage VS. A range-switching signal V1 is input into a gate electrode of the transistor 15, and a signal XV1 is input into a gate electrode of the transistor 16.

The signal XV1 has a polarity opposite to that of the range-switching signal V1 (namely, when the range-switching signal V1 is the power supply voltage VD, the signal XV1 is the power supply voltage VS; and when the range-switching signal V1 is the power supply voltage VS, the signal XV1 is the power supply voltage VD). The channel width W of the transistor 2 is 10 μm, and the channel width W of the transistor 4 is 990 μm. The channel width W of each of the transistors 15 and 16 is 50 μm, and the channel length L of each of the transistors 2, 4, 15, and 16 is 6 μm.

When V1=VS and XV1=VD, the transistor 15 is OFF and the transistor 16 is ON. Thus, a current I2 flowing between drain and source of the transistor 4 is nearly equal to zero. That is, when Isense=I1, provided that the mobility of each of the transistors 2 and 4 is 100 cm$^2$/V/S, Vkink=6 V, the thickness of the gate insulating film is 100 nm, and Ileak of the transistor 2 at Vds=Vgs=Vth is 10 nA, equation (6) is satisfied in a I1 range of 10 nA to 80 μA.

When V1=VD and XV1=VS, the transistor 15 is ON and the transistor 16 is OFF. Hence, I2=I1×99, namely, Isense=I1+I2=100×I1. Equation (6) is satisfied in an Isense range of 1 μA to 8 mA. Consequently, as in the first embodiment, measurement can be performed in an Isense range of 10 nA to 8 mA. That is, the measurement dynamic range is about 800,000:1. In the circuit configuration according to this embodiment, although the number of elements and the number of signals increase compared with the first embodiment, the voltage between drain and source applied on each of the transistor 2 and the transistor 4 is always constant. Thus, it is expected that the operation can be performed accurately in a wider range, which is advantageous.

In this example of configuration, instead of the comparator circuits 31 to 38 used in the first embodiment, eight CMOS inverters are arranged, the CMOS inverters including N-channel transistors 6N1 to 6N8 and P-channel transistors 6P1 to 6P8, gate electrodes of which being connected to the Node-A. The CMOS inverters are connected to terminals of output signals OUT1 to OUT8, respectively.

The individual inverters are designed to have different N/P width ratios and different operating points. Here, the operating point is defined as an input voltage at which the output from the inverter inverts. For example, in the N-channel transistor 6N1, channel width W=150 μm; in the P-channel transistor 6P1, channel width W=5 μm; in N-channel transistor 6N2, channel width W=50 μm; in P-channel transistor 6P2, channel width W=5 μm; in N-channel transistor 6N3, channel width w=20 μm; in P-channel transistor 6P3, channel width W=5 μm; in N-channel transistor 6N4, channel width W=20 μm; in P-channel transistor 6P4, channel width W=10 μm; in N-channel transistor 6N5, channel width W=10 μm; in P-channel transistor 6P5, channel width W=10 μm; in N-channel transistor 6N6, channel width w=10 μm; in P-channel transistor 6P6, channel width W=20 μm; in N-channel transistor 6N7, channel width W=5 μm; in P-channel transistor 6P7, channel width W=20 μm; in N-channel transistor 6N8, channel width W=5 μm; and in P-channel transistor 6P8, channel width w=50 μm.

By setting as described above, the inverter connected to the output signal OUTn has a lower operating point than that of the inverter connected to the output signal OUTn+1. It is possible to determine the voltage VA of the Node-A by referring to the output results of the output signals OUT1 to OUT8 as in the first embodiment. In this method, in comparison with the configuration shown in FIG. 1, the operating point voltages of the individual inverters vary depending on Vth of transistors, and thus the accuracy is low. However, the reference voltage Vref is not required, and the number of constituent elements is small. Consequently, this method is more suitable than the configuration shown in FIG. 1 in the case where an intended purpose is achieved by obtaining rough values.

The active matrix substrate, the electro-optical device, and the electronic apparatus, each including the electronic circuit according to this embodiment are completely the same as those in the first embodiment, and a description thereof will be omitted. Furthermore, in place of the CMOS inverters, CMOS clocked inverters may be used.

Third Embodiment

Figure 10:
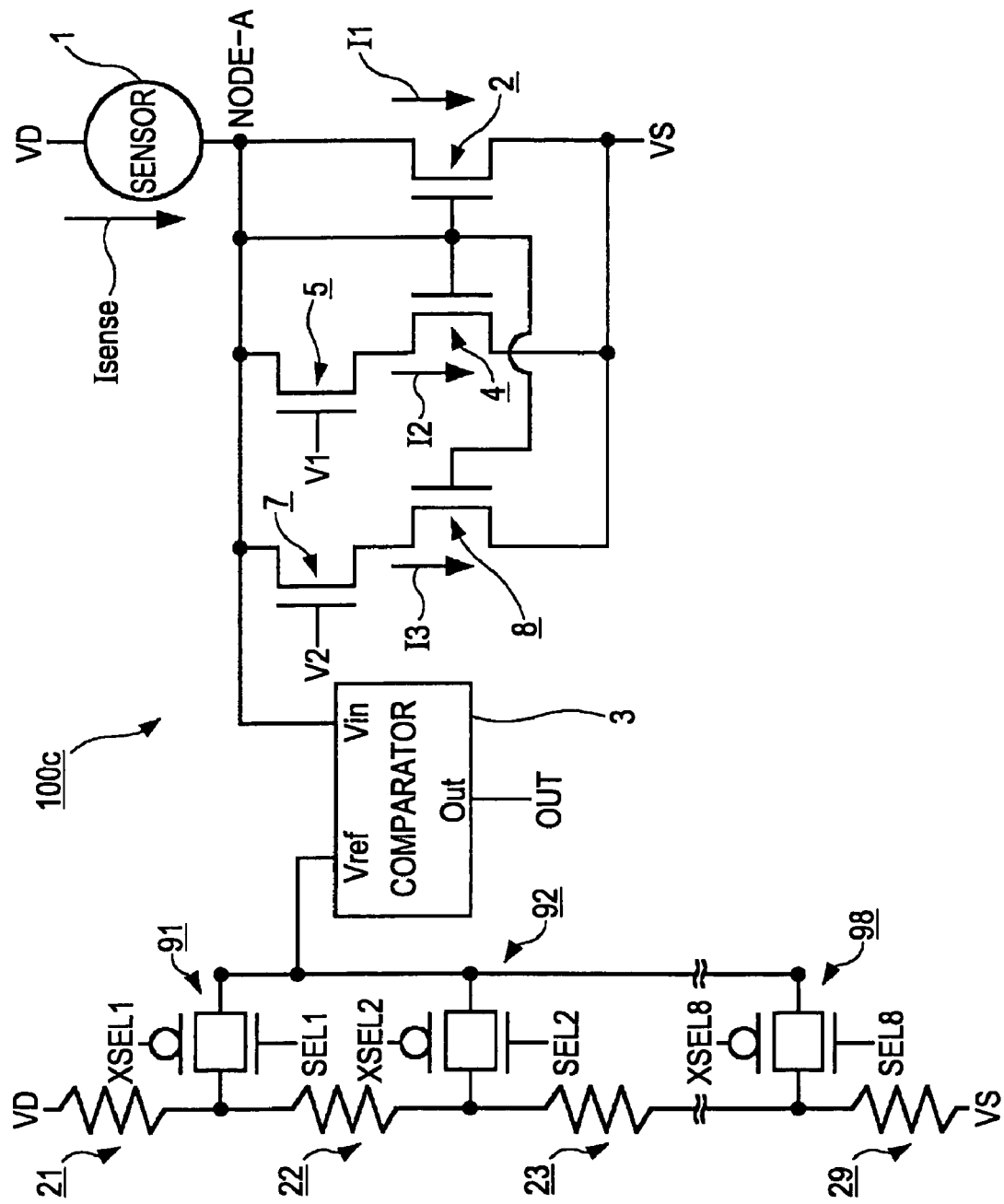
FIG. 10 is a circuit diagram showing a sensor and an A/D conversion circuit according to a third embodiment of the invention.

FIG. 10 is a circuit diagram showing a sensor 1 and an A/D conversion circuit 100c according to a third embodiment of the invention. Referring to FIG. 10, a transistor 2, a transistor 4, a transistor 8, a transistor 5, and a transistor 7 constitute a current-voltage conversion circuit that converts a current into a voltage. The transistor 4, the transistor 8, the transistor 5, and the transistor 7 constitute a range-switching circuit that switches the current-voltage conversion range of the current-voltage conversion circuit.

A gate electrode of each of the transistors 2, 4, and 8 is connected to a Node-A, and a source electrode of each of the transistors 2, 4, and 8 is connected to a power supply voltage VS. A drain electrode of the transistor 4 is connected via the transistor 5 to the Node-A, and a drain electrode of the transistor 8 is connected via the transistor 7 to the Node-A. A first range-switching signal V1 is input to the gate electrode of the transistor 5, and a second range-switching signal V2 is connected to the gate electrode of the transistor 7. The channel width W of the transistor 2 is 10 μm, the channel width W of each of the transistors 4 and 5 is 990 μm, the channel width W of each of the transistors 7 and 8 is 4,000 μm, and the channel length L of each of the transistors 2,4,5,7, and 8 is 6 μm.

When V2=VS and V1=VS, the transistors 5 and 7 are each OFF. Thus, a current I2 flowing between drain source of the transistor 4 and a current I3 flowing between drain and source of the transistor 8 are each nearly equal to zero. That is, provided that the mobility of each of the transistors 2, 4, and 8 is 100 cm$^2$/V/S, Vkink=6 V, the thickness of the gate insulating film is 100 nm, equation (6) is satisfied in an Isense (=I1) range of 10 nA to 80 μA. When V1=VD and V2=VD, the transistors 2, 4, and 8 have the same gate voltage (Vgs=VA−VS) and operate in a saturation region. Thus, on the basis of the width ratios, I3=I1×400 and I2=I1×99. That is, since Isense=I1+I2+I3, Isense=I1×500. Therefore, equation (4) is satisfied in an Isense range of 5 μA to 40 mA. Consequently, by switching between the first range-switching signal V1 and the second range-switching signal V2, it is possible to measure the current Isense in a range of 10 nA to 40 mA. That is, the measurement dynamic range is 4,000,000:1.

Since accuracy is degraded in the vicinity of the range switching point, i.e., at Isense in the range of 5 to 80 μA, it is preferable to use a setting in which V2=VD and V1=VS or a setting in which V2=VS and V1=VD in such a range.

According to this embodiment, in order to detect the voltage VA of the Node-A, a comparator circuit 3 only is used. A reference voltage Vref of the comparator circuit 3 is connected to ends of nine CMOS transmission gates 91 to 98. The other ends of the CMOS transmission gate 91 to 98 are connected to outputs of a ladder resistor including resistors 21 to 29 with supply voltages VD and VS, and applied with different voltages. When only one of the CMOS transmission gates 91 to 98 is turned on by selection signals SEL1 to SEL8 and opposite polarity signals XSEL1 to XSEL8, which have polarity opposite to that of the signals SEL1 to SEL8, any one of the voltages is applied as the reference voltage Vref to the comparator circuit 3. Consequently, by sequential switching of the selection signals SEL1 to SEL8 and the opposite polarity signals XSEL1 to XSEL8 and by measuring the output signal OUT at that time, it is possible to calculate the voltage VA.

For example, provided that the resistors 21 to 29 have the same resistance R1 of 1 MΩ, the voltages applied to the CMOS transmission gates 91, 92, . . . , 98, respectively, are (VD+VS)÷9, (VD+VS)×2÷9, . . . , (VD+VS)×8÷9. The voltage of the terminal of the output signal OUT is measured by sequentially selecting selection signals SEL1 to SEL8 and the opposite polarity signals XSEL1 to XSEL8 (during selection, the selection signal SELn is set to be the power supply voltage VD and the opposite polarity signal XSELn is set to be the power supply voltage VS; and during non-selection, oppositely set). If the output of the terminal of the output signal OUT is Low (≈VS) when the selection signals SEL1 to SEL3 and the opposite polarity signals XSEL1 to XSEL3 are selected, and if the output of the terminal of the output signal OUT is High (≈VD) when the selection signals SEL4 to SEL8 and the opposite polarity signals XSEL4 to XSEL8 are selected, the voltage VA is in a range of (VD+VS)×3÷9 to (VD+VS)×4÷9. By substituting the resulting value into equation (6), the range of current Isense is determined, and thus, the range of illuminance is easily determined.

The invention is not limited to the embodiments, and is applicable to any sensor that converts a measured quantity to a current, in addition to optical sensors and temperature sensors. As the electro-optical device, organic EL displays and the like may be used, besides liquid crystal display devices. As the substrate, in place of a glass substrate, a quartz substrate or a plastic substrate may be used.

Furthermore, the constituent elements of the embodiments may be properly combined with each other. Namely, in the first embodiment, in place of the comparator circuits 31 to 38, inverters including the N-channel transistors 6N1 to 6N8 and P-channel transistors 6P1 to 6P8 according to the second embodiment may be combined. On the other hand, in the second embodiment, instead of the inverters, the comparator circuits 31 to 38 according to the first embodiment may be used. The same applies to the third embodiment.

The number of range-switching signal is not limited to one or two, but may be three or more. Furthermore, the number of comparators, inverters, or transmission gates may be increased so that A/D conversion can be performed in increased number of gradations.

The entire disclosure of Japanese Patent Application No. 2006-124920, filed Apr. 28, 2006 is expressly incorporated by reference herein.

What is claimed is:

1. An electronic circuit having transistors disposed on a substrate, each transistor including an active layer made of thin-film polysilicon, the electronic circuit comprising:
   a sensor that converts a measured quantity into a current value;
   a current-voltage conversion circuit that converts the current value into a voltage; and
   a voltage detection circuit that detects the voltage converted by the current-voltage conversion circuit and outputs a predetermined signal,
   wherein the current-voltage conversion circuit includes a range-switching circuit that switches from a first current-voltage conversion range to a second current-voltage conversion range, wherein the current-voltage conversion circuit has field-effect transistors each including an active layer made of thin-film polysilicon disposed on the substrate and includes a first transistor and a second transistor connected in parallel, and a control circuit that is connected to the second transistor and controls a current flowing into the second transistor; and wherein the second transistor and the control circuit constitute the range-switching circuit, and by controlling the current flowing into the second transistor by a range-switching signal, the first current-voltage conversion range of the current-voltage conversion circuit is switched to a second current-voltage conversion range.

2. The electronic circuit according to claim 1, wherein the sensor is a PIN junction diode or a PN junction diode including an active layer made of thin-film polysilicon, the active layer being the same layer as the active layer of each of the first transistor and the second transistor, and the measured quantity corresponds to a light illuminance.

3. The electronic circuit according to claim 1, wherein the sensor is a resistor including a layer of thin-film polysilicon, the layer being the same layer as the active layer of each of the first transistor and the second transistor, and the measured quantity corresponds to a temperature.

4. The electronic circuit according to claim 1, wherein the voltage detection circuit includes a plurality of comparator circuits having the same circuit configuration, and different reference voltages are applied to the comparator circuits.

5. The electronic circuit according to claim 1, wherein the voltage detection circuit includes a plurality of CMOS inverters or CMOS clocked inverters having different ratios of the channel width of an N-channel transistor to the channel width of a P-channel transistor.

6. The electronic circuit according to claim 1, wherein the voltage detection circuit is a comparator circuit, and different reference voltages are applied sequentially thereto.

7. An electro-optical device comprising the electronic circuit according to claim 1.

8. An electronic apparatus comprising:
   the electro-optical device according to claim 7; and
   a display information processing circuit that processes display information to be displayed on the electro-optical device.

9. The electronic circuit according to claim 1, wherein the range-switching circuit switches from at least one of the first current-voltage conversion range and the second current-voltage conversion range to a third current-voltage conversion range.

10. The electronic circuit according to claim 1, wherein an upper limit of the first current-voltage conversion range is higher than a lower limit of the second current-voltage conversion range, such that the first current-voltage conversion range overlaps with the second current-voltage conversion range.

* * * * *